(12) United States Patent
Tompa (10) Patent No.: US 7,573,004 B1
(45) Date of Patent: Aug. 11, 2009

(54) FILAMENT SUPPORT ARRANGEMENT FOR SUBSTRATE HEATING APPARATUS

(75) Inventor: Gary S. Tompa, Belle Mead, NJ (US)

(73) Assignee: Structured Materials Inc., Piscataway, NJ (US)

( * ) Notice: Subject to any disclaimer, the term of this patent is extended or adjusted under 35 U.S.C. 154(b) by 196 days.

(21) Appl. No.: 11/707,795

(22) Filed: Feb. 16, 2007

Related U.S. Application Data (60) Provisional application No. 60/775,169, filed on Feb. 21, 2006.

(51) Int. Cl.
*H05B 3/68* (2006.01)
(52) U.S. Cl. ............................... 219/451.1; 219/461.1
(58) Field of Classification Search ... 219/443.1–468.2; 338/285, 304, 305, 310–314; 118/724, 725, 118/728–730
See application file for complete search history.

(56) References Cited

U.S. PATENT DOCUMENTS

| | | | | |
|---|---|---|---|---|
| 3,345,498 A | * | 10/1967 | Siegla | 219/461.1 |
| 3,567,906 A | * | 3/1971 | Hurko | 219/461.1 |
| 3,749,883 A | * | 7/1973 | Vodvarka et al. | 219/461.1 |
| 3,991,298 A | * | 11/1976 | Maake | 219/461.1 |
| 4,292,504 A | * | 9/1981 | Gebarowski et al. | 219/542 |
| 4,864,105 A | * | 9/1989 | Morgan et al. | 219/542 |

* cited by examiner

*Primary Examiner*—Sang Y Paik
(74) *Attorney, Agent, or Firm*—William L. Botjer (57) ABSTRACT

Apparatus for supporting the heater filament of the reactor in Chemical Vapor Deposition (CVD) system. The apparatus includes a recess or aperture disposed in a filament support plate; an electrically isolated rod supporting at least one of the coils of the filament, and extends into the recess or aperture in the support plate. A thermally insulating sleeve surrounds the rod. The post and sleeve arrangement provide a controlled and adjustable amount of lateral and vertical movement to the rod and filament to prevent damage to the filament caused by thermal expansion while providing lateral and vertical support to the filament.

19 Claims, 7 Drawing Sheets

FILAMENT SUPPORT ARRANGEMENT FOR SUBSTRATE HEATING APPARATUS

REFERENCE TO RELATED APPLICATIONS

This application claims priority from U.S. provisional application Ser. No. 60/775,169 filed Feb. 21, 2006

BACKGROUND AND SUMMARY OF THE INVENTION

This application is directed to substrate heating apparatus within the preferred embodiment of Chemical Vapor Deposition (CVD) apparatus and more specifically to an arrangement for supporting the heater filament of a deposition reactor.

Chemical Vapor Deposition (CVD) systems are widely used to deposit elemental, mixed phase and compound films in the manufacture of electronic devices, such as integrated circuits formed by the sequential or simultaneous deposition of compounds upon a heated substrate, which is usually in the form of a wafer that is typically mounted on a "susceptor" which may or may not rotate. The reactants are transported to the surface of the substrate, in the gas phase, by typically one or more carrier gases. The elements deposit on the wafer surface, forming the desired compound and any undesirable by-products are pumped away in a gaseous form. A heating element (filament) is mounted below the susceptor and heats the wafers. It is desirable to have the filament close to the susceptor to minimize power loses.

The filament of the heater assembly is subject to a number of problems which can lead to damage or failure, among these problems are: 1) warpage (into and out of its plane; such warping can cause the filament to contact the fixed or rotating susceptor leading to damage to the susceptor and filament 2) temperature asymmetries across the wafer and/or hardware (differential thermal expansion as it heats and cools or where different zones experience different values of heat loss leading to different local temperatures) 3) differing temperatures along the coils (where different zones experience different values of heat loss leading to different local temperatures) 4) lateral expansion which can cause adjacent coils to short out which can lead to catastrophic failure of the filament 5) reactivity with the process environment including reactivity with supporting elements such as insulators 6) fatigue wherein aging embrittlement leads to cracking failure in unsupported filaments (which are subject to general process system induced vibrations), among others. The problems are exacerbated by the increasing temperatures that are used in many advanced deposition methodologies.

The present invention is directed to apparatus for supporting the heater filament of the reactor in Chemical Vapor Deposition (CVD) system. The apparatus includes a recess or aperture disposed in a filament support plate; a rod is joined to at least one of the coils of the filament, and extends into the recess or aperture in the support plate. A thermally insulating sleeve surrounds the rod. The post and sleeve arrangement provide a controlled and adjustable amount of lateral and vertical movement to the rod and filament to prevent damage to the filament caused by thermal expansion while providing lateral and vertical support to the filament.

DESCRIPTION OF THE PREFERRED EMBODIMENTS

Figure 1:
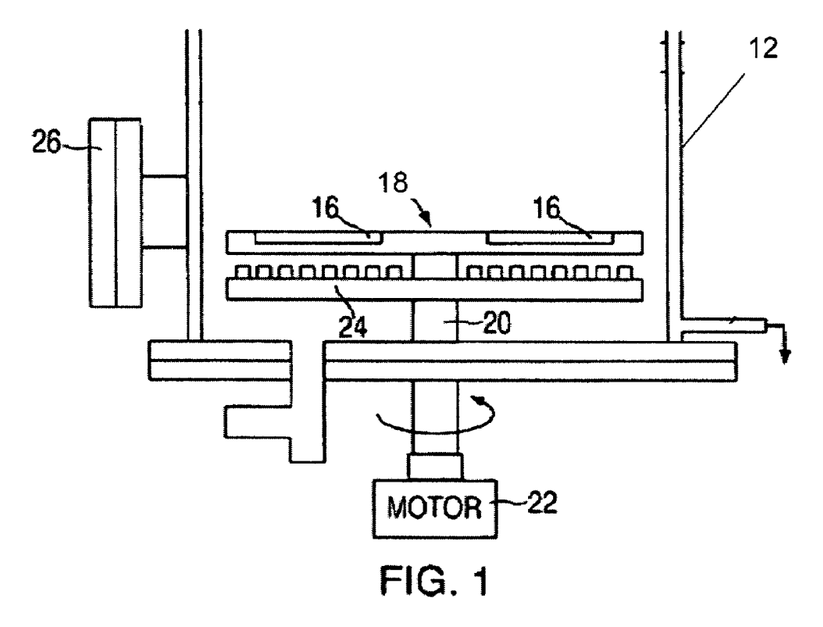
FIG. 1 illustrates a general overview of a Chemical Vapor Deposition (CVD) System.

FIG. 1 illustrates a Chemical Vapor Deposition (CVD) System 10 which, in general overview: includes a reactor chamber 14, sealed to the atmosphere, in which is mounted a gas and vapor distribution housing (showerhead—not shown) for the film growth reactant and carrier gases. The distribution housing directs the reactant gases over one or more substrate wafers 16, mounted, in this example, on a rotatable susceptor 18 which is rotated through a shaft 20 by a motor 22 mounted externally from reactor chamber 12, and which are heated by a heater unit 24. The reactant and carrier gases generated by external sources (not shown) are distributed though the distribution housing and flow over heated wafers 16 where the gases will decompose (react at the wafer surface) and deposit their compounds, thereafter an exhaust unit 26 will remove the spent gases from reactor chamber 14.

Figure 2:
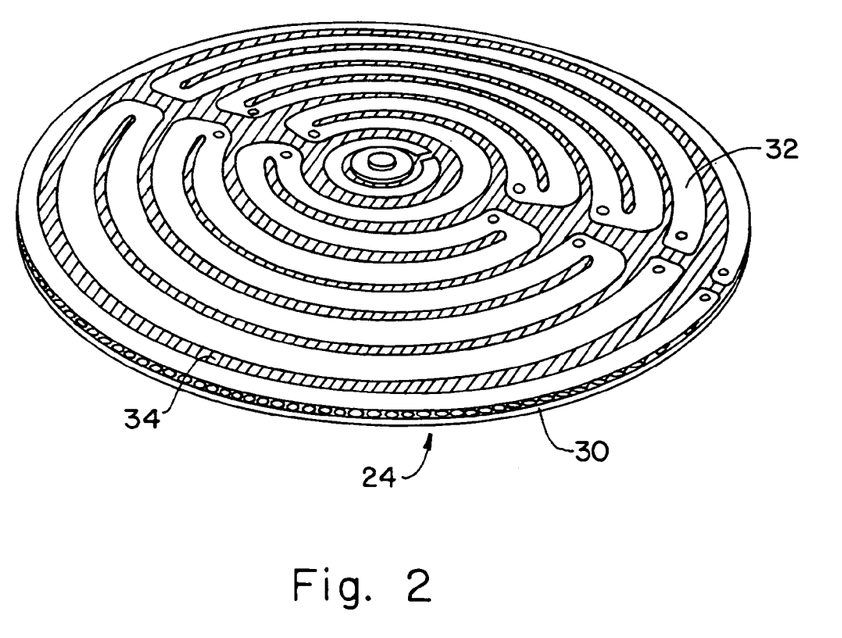
FIG. 2 illustrates a standard arrangement for supporting the heater element in a heater unit within a CVD system.

FIG. 2 illustrates the standard arrangement for supporting the heater element in a heater unit within a CVD system. Heater unit 24 includes a generally circular support plate 30 and a serpentine (or otherwise patterned) heater element (filament) 32. Disposed between plate 30 and element 32 are a number of cylindrical ceramic rods 34 upon which element 32 rests. Ceramic rods 34 provide support for element 32 and serve to thermally insulate it from support plate 30. Ceramic rods 34 prevent element 32 from sagging as it softens when heated by the operating current that flows through it. However, rods 34 only prevent element 32 from sagging downwardly, but do nothing to prevent element 32 form warping upwardly or moving laterally. Such warping can cause the filament to contact susceptor 18 leading to damage to susceptor 18 and filament 32. Lateral expansion of filament 32 can cause adjacent coils to short out, which can lead to catastrophic failure of filament 32. While vertical ceramic posts could be used to separate filament traces; they can crack or a warping filament can rise along their sides. At sufficient temperature insulating rods 34 have been known to react with element 32. These problems have caused a significant shortening of the average life of filaments 32 as well as damaging the other components of the CVD system or contaminating of the depositing material or imposing operational temperature limits lower than the filament material itself can tolerate. These problems are only exacerbated by the increasing temperatures that are used in advanced deposition methodologies.

Figure 3:
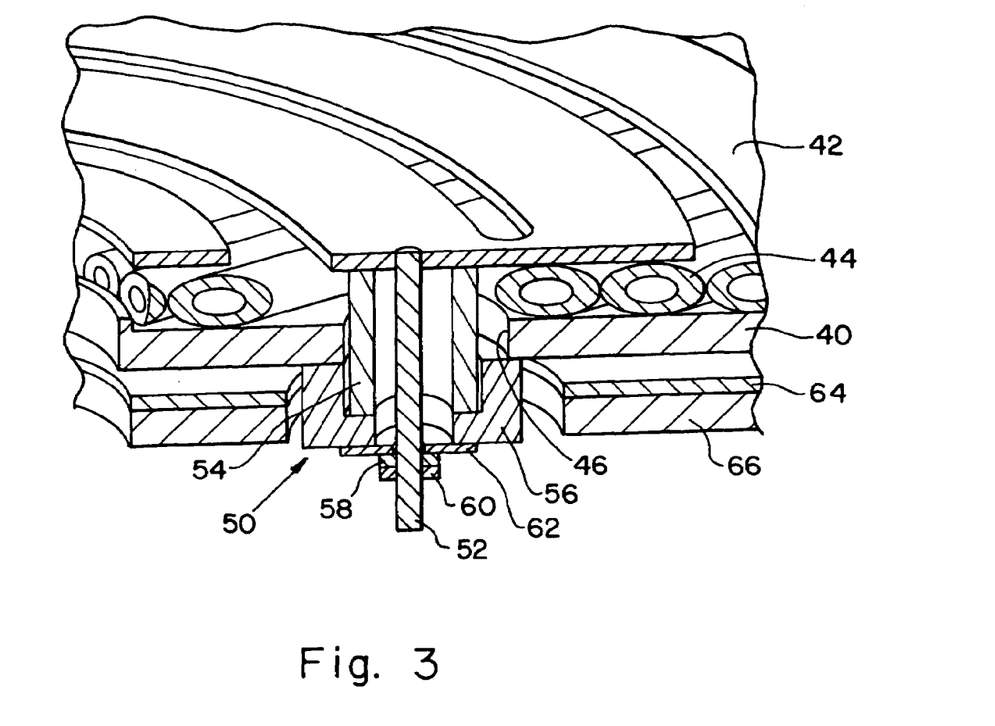
FIG. 3 illustrates a first embodiment of the present invention for use with filaments that are prone to sagging and or warpage and or lateral movement.

FIG. 3 illustrates a first embodiment of the present invention generally for use with filaments that are prone to sagging and or warpage. Such filaments are generally employed in a variety of CVD systems; including oxide systems as shown. FIG. 3 is a sectional view through a heater assembly that includes a filament support plate 40, filament 42 and ceramic filament support rods 44, as such these components are similar to those described above in FIG. 2. However, filament support plate 40 includes a plurality of regularly spaced apertures 46 in each of which is located a filament restraining system 50. Filament support plate 40 can be metallic or a ceramic insulating material. Filament restraining system 50 includes a threaded post 52 which is attached, such as by welding, bolting, pinning or riveting to filament 42. Post 52 is preferably made of a material which is thermally compatible with the material of filament 42 so that it has the same or nearly the same thermal expansion characteristics as that of filament 42. In some cases it may be preferred that the filament and post material are exactly the same. Surrounding the post is an annular insulating sleeve 54 which is preferably constructed from a material which is thermally resistant such as quartz or ceramic materials. In practice, the spacing between the sleeving material and the filament may be made large to either include a number of heat shields or reduce the heat load on the insulating sleeving materials. Surrounding sleeve 54 is a ceramic bottom cap 56 which has an inwardly disposed lip upon which the bottom of sleeve 54 rests. Threaded to the bottom of post 52 are locking nuts 58, 60 which support a retaining washer 62. Optional heat reflecting shields 64, 66 may be added to the bottom of the assembly and heat diffuser plates may be added above the filament but below the wafer plane.

The purpose of filament restraining system 50 is not to fixedly secure filament 42 in place, rather its purpose is to permit filament 42 a predetermined and adjustable degree of movement both laterally and vertically to accommodate the inherent thermal expansion of the filament without causing damage to it and/or the other components of the deposition apparatus. To this end apertures 46 in filament support plate 40 and insulating sleeves 54 are designed such that sleeves 54 are smaller than apertures 46 so that filament 42 and attached posts 52 may shift laterally when filament 42 is heated. Further, the inner diameter of sleeves 54 is larger than that of the outer diameter of posts 52. The clearances between sleeves 54, posts 52 and apertures 46 are configured so that the lateral movement of filament 42 is permitted but constrained such that adjacent coils of 42 cannot contact each other and short out, thus avoiding damage. Furthermore apertures 46 in filament support plate 40 may be made oblong in cross section rather than circular to accommodate the controlled expansion of filament 42

Similarly, locking nuts 58, 60 threaded to posts 52 are preferably positioned so as to permit a limited degree of vertical movement of filament 42. Locking nuts 58, 60 are adjusted so that that any vertical movement (warping) of filament 42 is permitted but constrained to prevent it from contacting rotating susceptor 18. Thus, by selection of the clearances between sleeves 54 and apertures 46 and the adjustment of locking nuts 58, 60 on posts 52, the operator of the CVD system can control the movement of filament 42 before damage can occur to either the filament itself or the other components of the CVD system.

Figure 4:
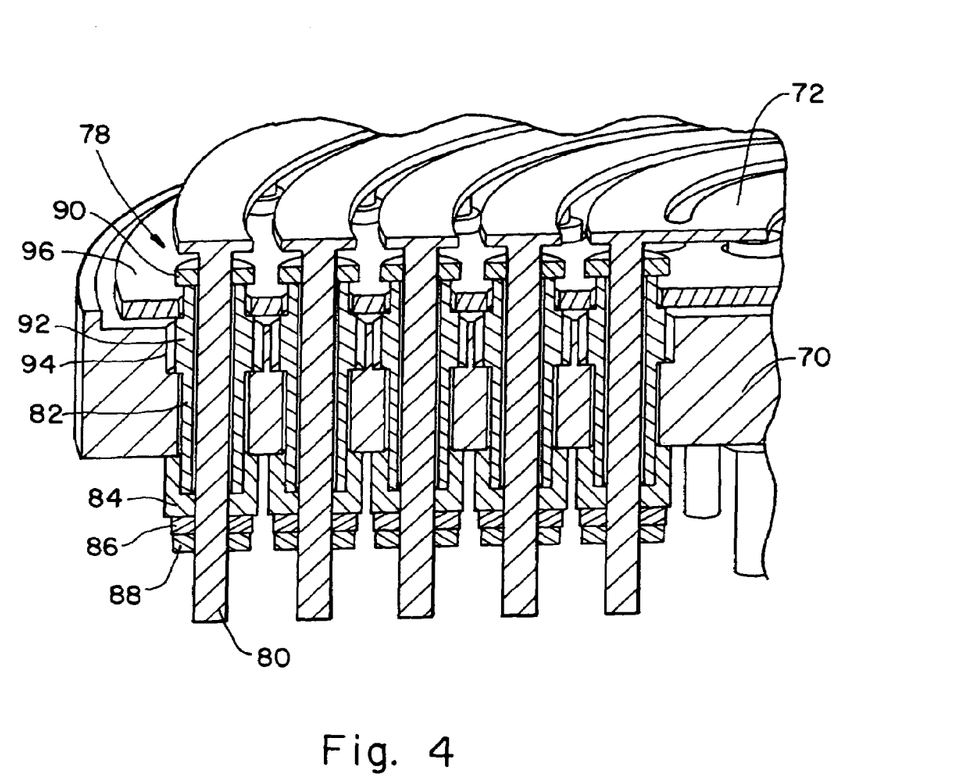
FIG. 4 illustrates a second embodiment of the present invention generally for use with filaments that are not prone to sagging but are subject to warpage and lateral movement.

FIG. 4 illustrates a second embodiment of the present invention which is generally for use with filaments that are not prone to sagging but are subject to warpage and lateral movement. Such filaments are generally employed in oxidizing or refractory CVD systems. FIG. 4 is a sectional view through a heater assembly that includes a filament support plate 70 and a filament 72 but does not include ceramic filament support rods. Filament support plate 70 includes a plurality of regularly spaced apertures 76 through which a filament restraining system 78 extends. Filament restraining system 78 includes a threaded post 80 which is joined, such as by welding, bolting or riveting to filament 72. Post 80 is preferably made of a material which is compatible with the material of filament 72 so that it has the same or nearly the same thermal expansion characteristics as that of filament 72. Loosely surrounding post 80 is an annular insulating sleeve 82 which is preferably constructed from a material which is thermally resistant such as quartz or ceramic. Surrounding sleeve 82 is a ceramic bottom cap 84 which has an inwardly disposed lip upon which the bottom of sleeve 82 rests. Threaded to the bottom of post 52 are locking nuts 86, 88. Joined to the upper portion of post 80 is a collar 90 which serves to limit the downward motion of filament 72 as it abuts the top of sleeve 82. Sleeve 82 has a wider middle portion 92 which rests in a widened portion 94 of apertures 76. A heat insulating or conducting reflecting shield 96 may be optionally disposed above filament support plate 70. While only one such shield is shown, multiple shields may be used. Similarly, while only a heat shield is shown below the filament, a cylindrical shield having a diameter larger than the filament may surround the filament to reflect lateral heat radiation.

As was the case with the arrangement of FIG. 3 the purpose of filament restraining system 78 is preferably not to fixedly secure filament 72 in place, rather its purpose is to permit filament 72 a predetermined degree of movement both laterally and vertically. To this end the clearances between sleeves 54 and apertures 76, as well as the clearances between posts 80 and sleeves 54, are configured so that filament 72 and posts 80 may shift laterally when filament 72 is heated. The clearances between sleeves 80 and apertures 76 are adjusted so that the lateral movement of filament 72 is constrained such that adjacent coils of 72 cannot contact each other resulting in a direct electrical short. Apertures 76 in filament support plate 40 may also be oblong in cross section rather than circular to accommodate the controlled expansion of filament 72. Similarly, locking nuts 86, 88 threaded to posts 80 are preferably positioned so as to permit a limited degree of vertical movement of filament 72 to prevent it from contacting rotating susceptor 18. Thus by selection of the clearances between sleeves 80 and apertures 76 and the adjustment of locking nuts 86, 88 the operator of the CVD system can control the movement of filament 72 before damage can occur to either the filament itself or the other components of the CVD system. Collar 90 serves to limit the downward motion of filament 72 as it abuts the top of sleeve 82 and the downward motion of sleeves 80 are limited by the abutment of wider middle portion 92 against filament support plate 70. Insulating sleeve 84 limits the extent to which the filament can rise vertically.

Figure 5:
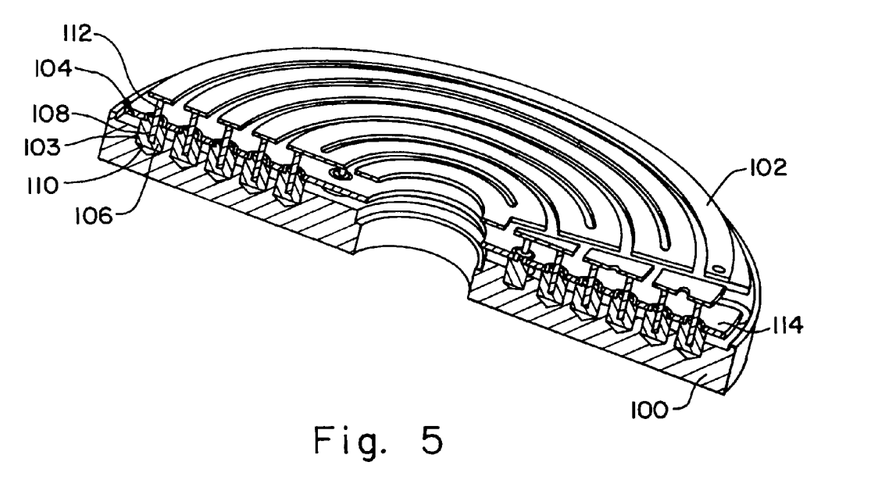
FIG. 5 illustrates a third embodiment of the present invention wherein the filament is supported from sagging and the filament may be attached to the pins or allowed to slide laterally on top of the pins.

FIG. 5 illustrates a third embodiment of the present invention. FIG. 5 is a sectional view through a wafer substrate heater assembly that includes a filament support plate 100 and a filament 102. Filament support plate 100 includes a plurality of regularly spaced apertures 103, however these apertures do not fully extend through the width of filament support plate 100. A filament restraining system 104 is disposed in each aperture 102. Filament restraining system 104 includes an annular insulating sleeve 106 which has an aperture 108 with closed lower end 110 and which is preferably constructed from a material which is thermally resistant such as quartz or ceramic. In this configuration a vertical post 112 is either used solely to prevent the filament from sagging or may be joined, such as by welding or riveting to filament 102 and rests against the closed lower end 110 of annular insulating sleeve 106. Post 112 is again preferably made of a material which is thermally compatible with the material of filament 102 so that it has the same thermal expansion characteristics as that of filament 102. A heat insulating/reflecting shield 114 may be optionally disposed above filament support plate 100. In the cases where the primary concerns are sagging and lateral expansion, the post 112 does not need to be attached to the filament and it may, in fact, be more advantageous to allow the filament to slide over the pin. The difference here is that post 112 can be made of a metal that can withstand higher filament contact temperatures than a ceramic. An important feature is that post 112 is located and supported in its insulating sleeve to an extent that it does not catch on the filament. Further, at lower temperatures a ceramic post 112 could be used in this configuration as well.

The operation of filament restraining system 104 is again preferably not to fixedly secure filament 102 in place, rather its purpose is to permit filament 102 a predetermined degree of movement both laterally and vertically. As such the clearances between sleeves 106 and apertures 102, as well as the clearances between posts 112 and sleeves 106, are configured so that filament 102 and posts 112 is allowed to shift laterally when filament 72 is heated. The clearances between sleeves 106 and apertures 102 are adjusted so that the lateral movement of filament 102 is constrained such that adjacent coils of filament 102 cannot contact each other and short out. Apertures 102 in filament support plate 40 may also be oblong in cross section rather than circular to accommodate the controlled expansion of filament 102. As posts 112 are a loose fit in apertures 108 of insulating sleeve 106 serves filament 102 may move up and down vertically in a controlled manner the downward motion of filament 72 is limited as by the abutment of posts 112 with the closed lower end 110 of sleeve 108 which also removed the need for ceramic support rods in this embodiment.

Figure 6:
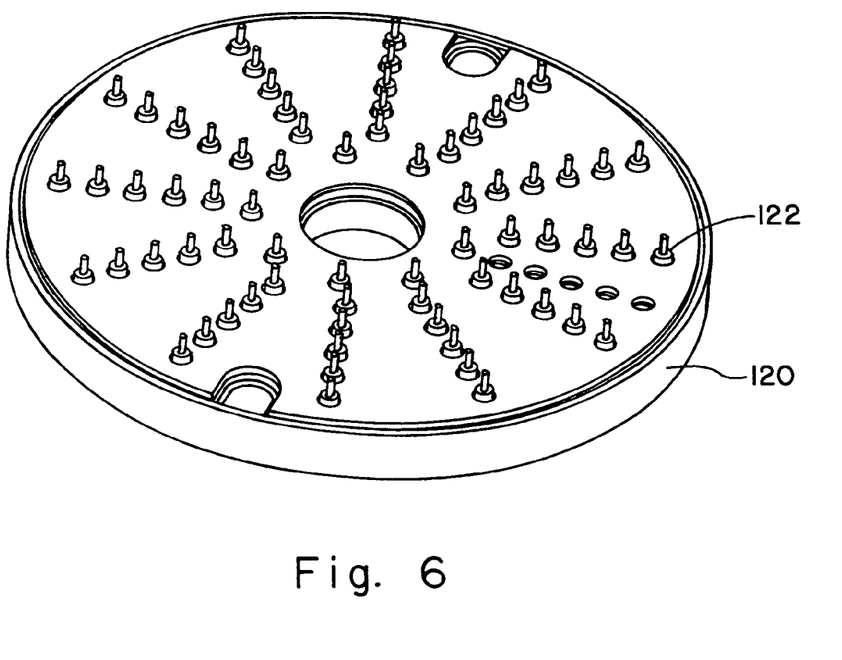
FIG. 6 is a perspective view of filament support plate (as shown in FIG. 5 but without the filament) to illustrate an exemplary arrangement of the components of the filament restraining system.

FIG. 6 is a perspective view of filament support plate 120 with the filament not shown to illustrate an exemplary arrangement of the components 122 of filament restraining system, which may in accordance any of the embodiments described heretofore is preferred. As shown herein this exemplary arrangement comprises radial "spokes" extending outwardly from the center of filament support plate 120 to the edges. Of course many other exemplary arrangements are possible. The arrangement configuration, spacing and number of filament restraining systems may be varied depending on the support needs of the filament to be used in the CVD application at hand.

Figure 7:
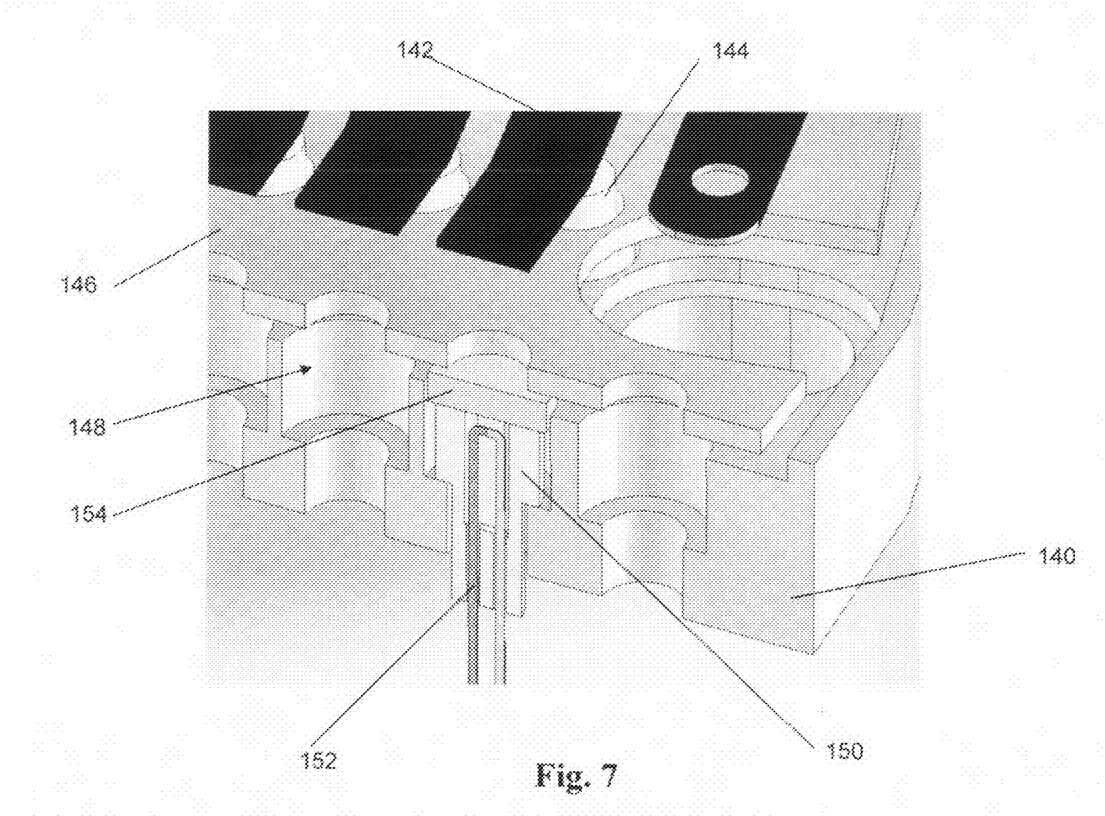
FIG. 7 is a sectional view of a filament support plate for use with a thermocouple to monitor the operating temperature of the filament.

The present invention may also utilize a thermocouple to monitor the operating temperature of the filament. FIG. 7 is a sectional view of a filament support plate 140 having a filament 142 which is supported by number of filament support rods 144 which extend through a filament heat shield 146. Filament support plate 140 includes apertures 148 which have a larger diameter at their upper end, through which filament support rods 144 extend. Located in one or more of apertures 148 is a thermocouple isolation sleeve 150 in which is disposed a thermocouple 152 (with junction). Thermocouple isolation sleeve 150 has a larger diameter at its so that it rests in aperture 148 upper end to support and isolate thermocouple 150. Disposed above thermocouple isolation sleeve 150 is a thermocouple insulating isolation disc 154. Isolation sleeve 150 and isolation disc 154, which are preferably formed from insulating materials, serve to isolate thermocouple 152 from filament support plate 140 so that it may accurately monitor the operating temperature of filament 142.

The invention has been described with respect to heated substrate preferred embodiments for film deposition on a wafer surface. However, as those skilled in the art will recognize, modifications and variations in the specific details which have been described and illustrated may be resorted to without departing from the spirit and scope of the invention as defined in the appended claims. For example, similar problems are experienced in reactors wherein the wafer substrate assembly rotates using planetary rotation or where the wafer substrate assembly is not rotated at all. The number and distribution of heat shields or heat reflectors below the filament surface may be varied in number and the number and distribution of heat diffusers above the filament surface. The locking bolt structure may be replaced by a variety of mechanisms including but not limited to locking ring clips or cotter pins. The described supporting pins may have a variety of terminations including rounds, flats, bars and the like.

What is claimed is:

1. In a heating system for a substrate having a support plate and a heating system with a heating filament, the improvement comprising:
   a) a support plate having at least one aperture disposed therein;
   b) a rod joined to at least one of the coils of the filament, and extending through said at least one aperture disposed in said support plate;
   c) a thermally insulating sleeve surrounding said rod and extending through said at least one aperture disposed in said support plate;
   d) means for providing a controlled predetermined degree of lateral movement to said rod and said filament; and
   e) means for providing a controlled predetermined degree of vertical movement to said rod and said filament.

2. The heating system as claimed in claim 1, further including a thermally insulating cap surrounding said the lower portion of said sleeve.

3. The heating system as claimed in claim 1, wherein the rod joined to at least one of the coils of the filament is threaded and the means for providing a controlled predetermined degree of vertical movement to said rod and said filament comprise adjusting nuts threaded to said threaded rod.

4. The heating system as claimed in claim 1, wherein means for providing a controlled predetermined degree of lateral movement to said rod and said filament comprise providing a predetermined clearance between at least one of said sleeve and said rod and said aperture.

5. The heating system as claimed in claim 1, further including a plurality of thermally insulated rods disposed between said support plate and said coiled heating filament to prevent said filament from sagging.

6. The heating system as claimed in claim 1, further including a sleeve joined to the upper portion of said rod to limit the amount of downward movement of said filament.

7. The heating system as claimed in claim 1, further including at least one heat reflecting shield below the filament or filament support plate.

8. The heating system as claimed in claim 1, further including at least one heat diffusing plate between the filament and the support plate.

9. The heating system as claimed in claim 1, wherein said rod is comprised of a material having a coefficient of thermal expansion similar to said filament.

10. The heating system as claimed in claim 1, wherein said thermally insulating sleeve is constructed of a ceramic material.

11. The heating system as claimed in claim 1, further including a thermocouple isolation sleeve disposed in at least one of said apertures and a thermocouple disposed within said thermocouple isolation sleeve.

12. The heating system as claimed in claim 11, further including a thermocouple isolation disc disposed atop said thermocouple isolation sleeve.

13. In a heating system for a substrate having a support plate and a heating system with a heating filament, the improvement comprising:
   a) a support plate having at least one recess disposed therein;
   b) a rod supporting at least one of the coils of the filament, and extending into the recess disposed in said support plate;
   c) a thermally insulating sleeve having a closed end disposed in said at least one recess disposed in said support plate and surrounding said rod;
   d) means for providing a controlled predetermined degree of lateral movement to said rod and said filament; and
   e) means for providing a controlled limit of vertical downward movement to said rod and said filament.

14. The heating system as claimed in claim 13, wherein said rod supporting at least one of the coils of the filament rests on the closed end of the thermally insulating sleeve to provide said controlled limit of vertical downward movement to said rod and is free to move vertically upwardly within said sleeve.

15. The heating system as claimed in claim 13, wherein said rod is free to move laterally within said sleeve until it contacts said sleeve to provide said controlled predetermined degree of lateral movement to said rod.

16. The heating system as claimed in claim 13, wherein said rod is joined at its upper end to said filament.

17. The heating system as claimed in claim 13, wherein said rod is comprised of a material having a coefficient of thermal expansion similar to said filament.

18. The heating system as claimed in claim 13, wherein said thermally insulating sleeve is constructed of a ceramic material.

19. The heating system as claimed in claim 13, further including at least one heat diffusing plate between the filament and the support plate.

* * * * *